US012780652B2

(12) United States Patent
Liu et al.

(10) Patent No.: US 12,780,652 B2
(45) Date of Patent: Nov. 3, 2026

(54) MANUFACTURING METHOD FOR MICRO-ELECTRO-MECHANICAL MICROPHONE

(71) Applicant: AAC Microtech (Changzhou) Co., Ltd., Changzhou (CN)

(72) Inventors: Yuwei Liu, Singapore (SG); Rui Zhang, Changzhou (CN)

(73) Assignee: AAC Microtech (Changzhou) Co., Ltd., Changzhou (CN)

( * ) Notice: Subject to any disclaimer, the term of this patent is extended or adjusted under 35 U.S.C. 154(b) by 246 days.

(21) Appl. No.: 18/668,264

(22) Filed: May 20, 2024

(65) Prior Publication Data

US 2025/0187908 A1 Jun. 12, 2025

Related U.S. Application Data

(63) Continuation of application No. PCT/CN2023/137368, filed on Dec. 8, 2023.

(51) Int. Cl.
*B81C 1/00* (2006.01)
*B81B 3/00* (2006.01)

(52) U.S. Cl.
CPC ........ *B81C 1/00666* (2013.01); *B81B 3/0072* (2013.01); *B81B 2201/0257* (2013.01); *B81B 2203/0127* (2013.01); *B81C 2201/013* (2013.01); *B81C 2201/0174* (2013.01)

(58) Field of Classification Search
CPC .... B81B 2201/0257; B81B 2203/0127; B81B 3/0072; B81C 1/00666; B81C 2201/013; B81C 2201/0174; H04R 19/005; H04R 19/04; H04R 2201/003; H04R 31/00
See application file for complete search history.

(56) References Cited

FOREIGN PATENT DOCUMENTS

| | | | | |
|---|---|---|---|---|
| CN | 111818414 A | * 10/2020 | ............. | H04R 19/04 |
| CN | 119071705 A | * 12/2024 | ........... | H04R 31/003 |

* cited by examiner

*Primary Examiner* — Edward Chin
(74) *Attorney, Agent, or Firm* — Wiersch Law Group

(57) ABSTRACT

Provided is a manufacturing method for a micro-electro-mechanical microphone, including: providing a substrate, and forming a first baffle on the substrate; forming a diaphragm at a side of the first baffle, an orthographic projection of a periphery of the diaphragm towards the first baffle falling onto the first baffle; forming a second baffle at a side of the diagram at an interval, the second baffle being connected to the first baffle, and an orthographic projection of the second baffle towards the diaphragm at least partially falling onto a periphery of the diaphragm; forming a back-plate at a side of the second baffle at an interval, the back-plate including acoustic through-holes; and etching the substrate to form a back-cavity. The manufacturing method aims to improve a degree of freedom of the diaphragm to improve sensitivity of the micro-electro-mechanical microphone while improving the structural strength of the diaphragm.

9 Claims, 10 Drawing Sheets

MANUFACTURING METHOD FOR MICRO-ELECTRO-MECHANICAL MICROPHONE

TECHNICAL FIELD

The present disclosure relates to the technical field of microphones, and in particular, to a manufacturing method for a micro-electro-mechanical microphone.

BACKGROUND

With the development of wireless communication, users have increasingly high requirements for the call quality of a mobile phone. As a voice pickup device of a mobile phone, the microphone directly affects the call quality of the mobile phone.

Due to the characteristics of miniaturization, easy integration, high performance, and low cost, Micro-Electro-Mechanical System (MEMS) technology has gained favor in the industry, and MEMS microphones are widely used in current mobile phones. Commonly used MEMS microphones are capacitive, that is, such an MEMS microphone includes a diaphragm and a back-plate, which constitute an MEMS acoustic sensing capacitor. Regarding high-performance MEMS microphones, in addition to requiring low noise design, high sensitivity design is also an important factor that needs to be considered in current designs. In the related art, the MEMS microphone adopts the design of four cantilever beams, so that the diaphragm can obtain a great degree of freedom and thus achieve high sensitivity.

However, in a reliability experiment, a narrow cantilever beam in the above-described MEMS microphone is a weak fracture point of the diaphragm in an impact experiment between the diaphragm and the substrate or the back-plate. Based on this, it needs to provide a new manufacturing method for a micro-electro-mechanical microphone, to improve the structural strength of the diaphragm while improving its degree of freedom.

SUMMARY

The present disclosure aims to overcome the above-described technical problems and provide a manufacturing method for a micro-electro-mechanical microphone that is capable of improving the structural strength of a diaphragm while improving its degree of freedom.

The present disclosure provides a manufacturing method for a micro-electro-mechanical microphone, and the manufacturing method includes: providing a substrate, and depositing a first oxide layer on a first surface of the substrate; patterning the first oxide layer, the first oxide layer including first connecting through-holes; depositing a first silicon nitride layer on a surface of the first oxide layer until the first connecting through-holes are fully filled, and patterning the first silicon nitride layer to form a first baffle; depositing a second oxide layer on a surface of the first baffle, and patterning the second oxide layer, the second oxide layer including a second connecting through-hole; depositing a first polysilicon layer on a surface of the second oxide layer until the second connecting through-hole is fully filled, and patterning the first polysilicon layer to form a diaphragm, an orthographic projection of a periphery of the diaphragm towards the first baffle falling onto the first baffle; depositing a third oxide layer on a surface of the diaphragm, and patterning the third oxide layer to expose at least part of the first baffle; depositing a second silicon nitride layer on a surface of the third oxide layer, and patterning the second silicon nitride layer to form a second baffle connected to the first baffle, an orthographic projection of the second baffle towards the diaphragm at least partially falling onto the periphery of the diaphragm; depositing a fourth oxide layer on a surface of the second baffle, depositing a back-plate material layer on a surface of the fourth oxide layer, and patterning the back-plate material layer to form a back-plate, the back-plate including acoustic through-holes; back-etching the substrate to form a back-cavity corresponding to a middle main body region of the back-plate; removing the third oxide layer and the fourth oxide layer through the acoustic through-holes, and removing the first oxide layer and the second oxide layer above the back-cavity through the back-cavity.

As an improvement, the patterning the first oxide layer includes: forming the first connecting through-holes each having an annular shape by etching along an edge of the first oxide layer at a position close to the edge of the first oxide layer.

As an improvement, the first connecting through-holes are spaced apart from each other along a direction from a central portion to an edge portion of the first oxide layer.

As an improvement, the patterning the second oxide layer includes: forming the second connecting through-hole by etching at a position close to an edge of the second oxide layer.

As an improvement, a part of the first polysilicon layer that fully fills in the second connecting through-hole is a lead-out electrode of the diaphragm.

As an improvement, depositing the first oxide layer includes: sequentially depositing a first sub-oxide layer and a second sub-oxide layer, a deposition thickness of the second sub-oxide layer being greater than a deposition thickness of the first sub-oxide layer.

As an improvement, a ratio of a thickness of the second sub-oxide layer to a thickness of the first sub-oxide layer ranges from 2 to 5.

As an improvement, the forming the back-cavity includes: thinning and etching the substrate from a second surface of the substrate.

As an improvement, the depositing the back-plate material layer includes: sequentially depositing a third silicon nitride layer and a second polysilicon layer.

Compared with solutions in the related art, the manufacturing method for the micro-electro-mechanical microphone provided by the embodiments of the present disclosure has the advantages that the first baffle and the second baffle are respectively arranged at two ends of the diaphragm along the vibrating direction, so that displacement of the diaphragm in the vibrating direction is limited by the first baffle and the second baffle, thereby preventing displacement of diaphragm from reaching a degree of a fracture stress of the diaphragm, thereby improving the structural strength of the diaphragm.

BRIEF DESCRIPTION OF DRAWINGS

In order to better illustrate technical solutions in embodiments of the present disclosure, the accompanying drawings used in the embodiments are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

The technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

Figure 1:
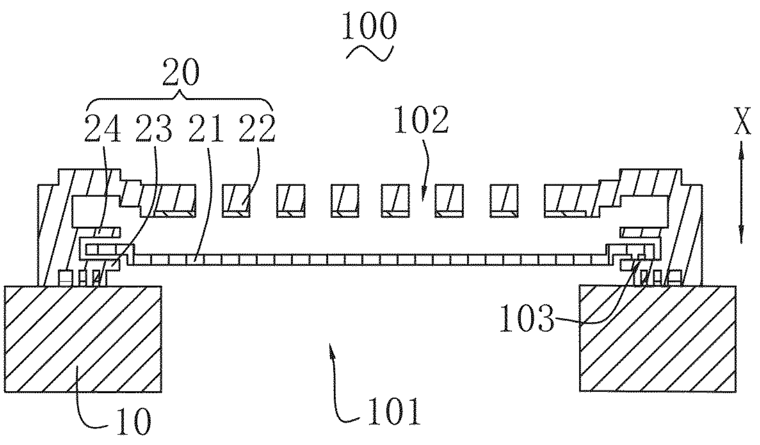
FIG. 1 is a schematic structural diagram of a micro-electro-mechanical microphone according to some embodiments of the present disclosure.

Referring to FIG. 1, a micro-electro-mechanical microphone 100 formed by using a manufacturing method provided by an embodiment of the present disclosure includes a substrate 10 and a capacitor system 20 provided on the substrate 10, and the capacitor system 20 is connected to and insulated from the substrate 10.

The substrate 10 is formed by, for example, a semiconductor material, such as silicon, and the substrate 10 includes a back-cavity 101, a first surface 10A and a second surface 10B opposite to the first surface 10A. Correspondingly, in the following description of the embodiments, the first surface 10A represents an upper surface direction, and the second surface 10B represents a lower surface direction. The back-cavity 101 can be formed by a bulk silicon process or dry etching.

The capacitor system 20 includes a diaphragm 21, a back-plate 22 opposite to the diaphragm 21, and a first baffle 23 and a second baffle 24 respectively provided at a lower side and an upper side of the diaphragm 21. The diaphragm 21 includes an electrode lead-out portion 103, the diaphragm 21 is connected to the first baffle 23 through the electrode lead-out portion 103, and the remaining portion of the diaphragm 21 is spaced apart from the first baffle 23 in a vibrating direction X. The diaphragm 21 is spaced apart from the second baffle 24 in the vibrating direction X. In this way, the diaphragm 21 is connected to the first baffle 23 only through the electrode lead-out portion 103, and the remaining portion of the diaphragm 21 is not connected to any other member in the vibrating direction X, thereby improving a release degree of the diaphragm 21. The diaphragm 21 has a great degree of freedom in the vibrating direction X, thereby improving the sensitivity of the micro-electro-mechanical microphone 100.

In the embodiments of the present disclosure, the electrode lead-out portion 103 is an lead-out electrode of the diaphragm 21.

Meanwhile, a projection of a peripheral portion of the diaphragm 21 overlaps with a projection of the first baffle 23 in the vibrating direction X, and overlaps with a projection of the second baffle 24 in the vibrating direction X, so that the first baffle 23 and the second baffle 24 limit the diaphragm 21 during vibration. In this way, it prevents displacement of diaphragm 21 from reaching a degree of a fracture stress of the diaphragm 21, thereby reducing a risk of fracture of the diaphragm 21 due to excessive displacement during vibration, thus improving the structural strength of the diaphragm 21.

When the micro-electro-mechanical microphone 100 is powered on, the diaphragm 21 and the back-plate 22 carry electric charges having different/opposite polarities, thereby forming a capacitor. When the diaphragm 21 vibrates under an action of sound waves, a distance between the back-plate 22 and the diaphragm 21 changes, resulting in a change in terms of the capacitance of the capacitor system 20, thereby converting the sound wave signal into an electrical signal, to achieve a corresponding function of the micro-electro-mechanical microphone 100.

In the embodiments of the present disclosure, a cross section of the diaphragm 21 in a direction perpendicular to the vibrating direction X may be, but not limited to, a rectangular shape or a circular shape.

The first baffle 23 and the second baffle 24 may be formed by or include a semiconductor material such as silicon, for example, germanium, silicon germanium, silicon carbide, gallium nitride, indium, indium gallium nitride, indium gallium arsenide, indium gallium zinc oxide, or other elements and/or compound semiconductors (e.g., III-V compound semiconductors such as gallium arsenide or indium phosphide, or II-VI compound semiconductors, or ternary compound semiconductors, or quaternary compound semiconductors). It may also be formed by or include at least one of the following: metal, dielectric material, piezoelectric material, piezoresistive material, and ferroelectric material. It may also be formed by a dielectric material such as silicon nitride.

In some embodiments of the present disclosure, the first baffle 23, the second baffle 24 and the back-plate 22 may be formed into one piece.

Figure 2:
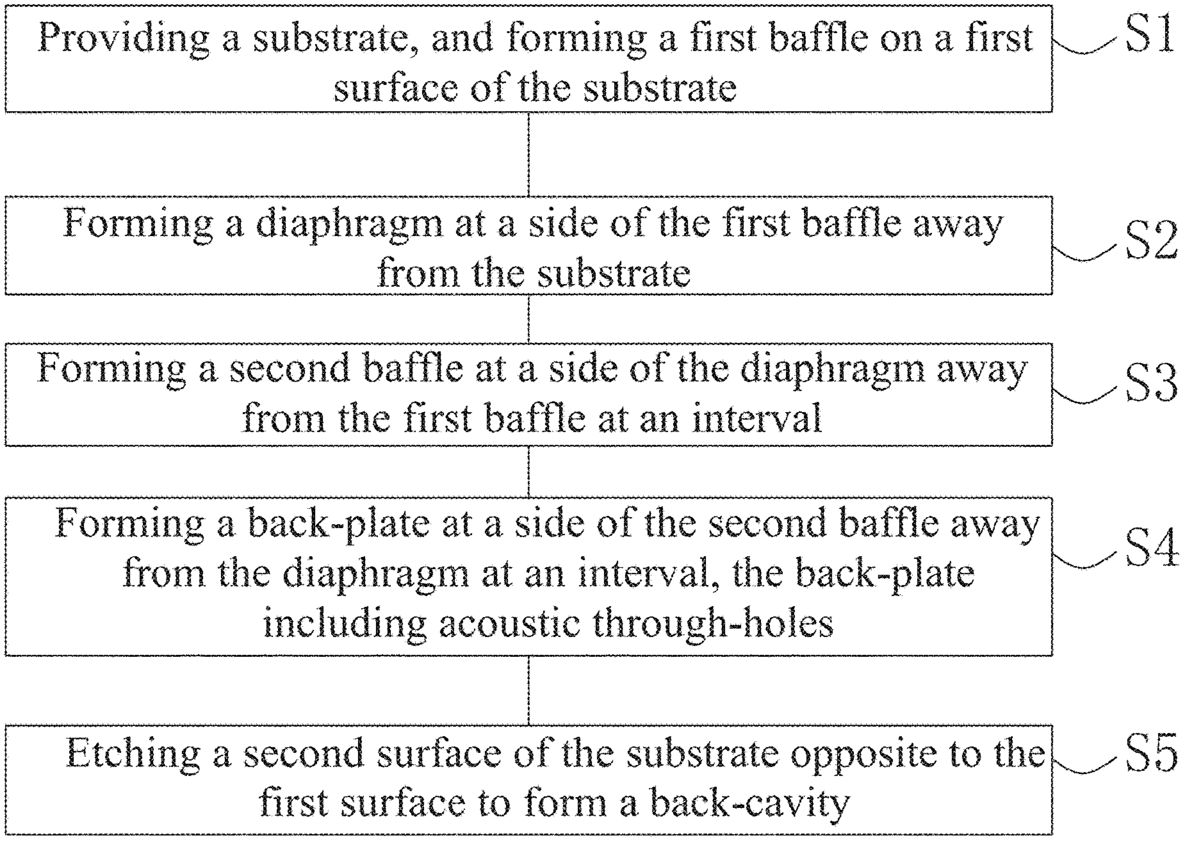
FIG. 2 is a flowchart of a manufacturing method for a micro-electro-mechanical microphone according to some embodiments of the present disclosure.
Figure 3A:
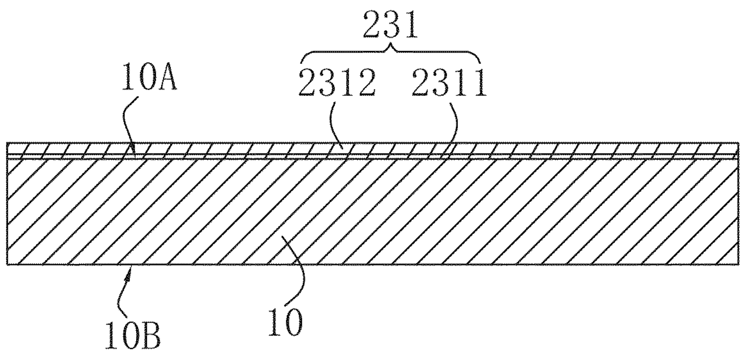
FIGS. 3*a*-3*o* are schematic diagrams illustrating a manufacturing process for a micro-electro-mechanical microphone according to some embodiments of the present disclosure.
Figure 3B:
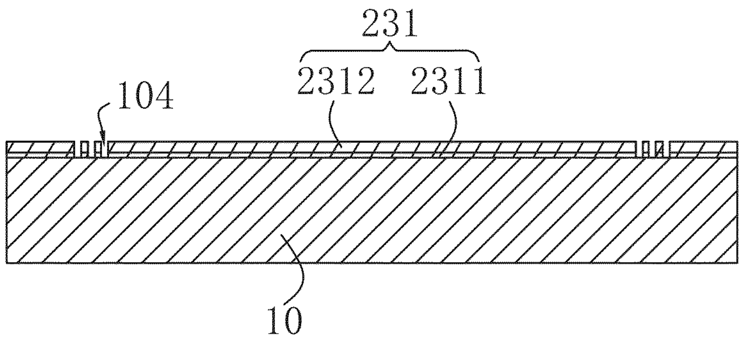
Figure 3C:
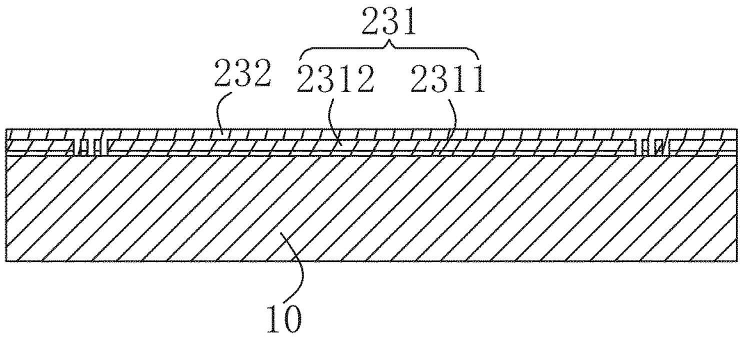
Figure 3D:
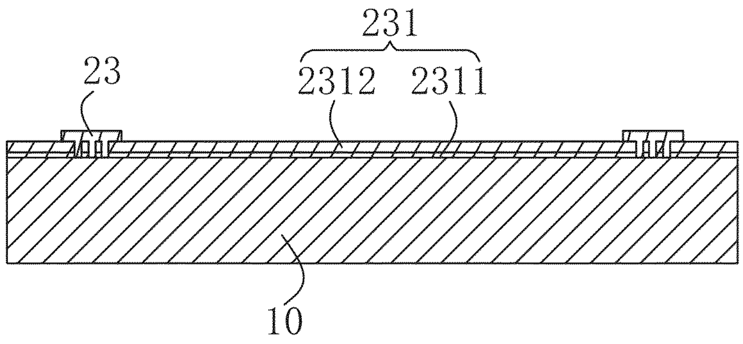
Figure 3E:
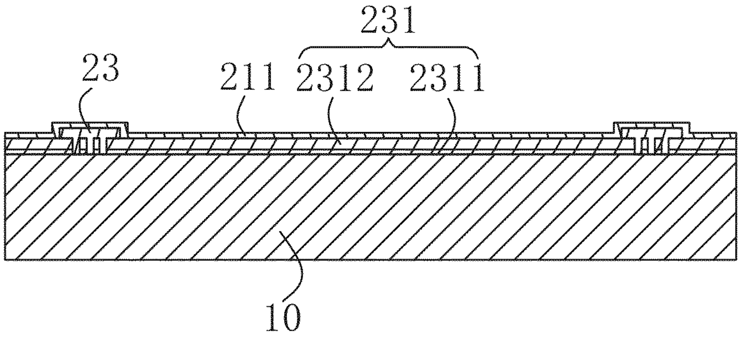
Figure 3F:
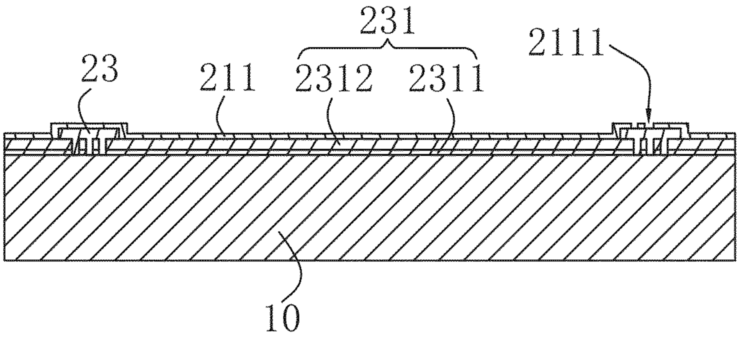
Figure 3G:
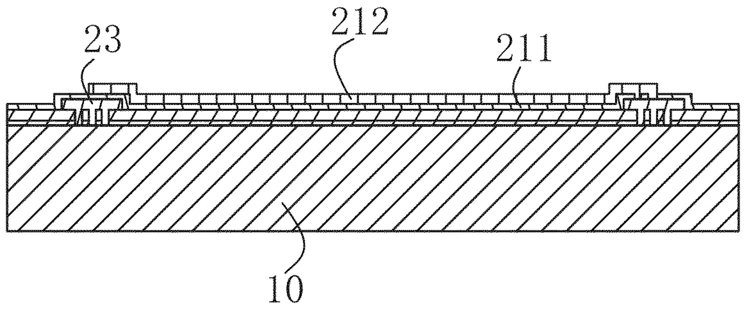
Figure 3H:
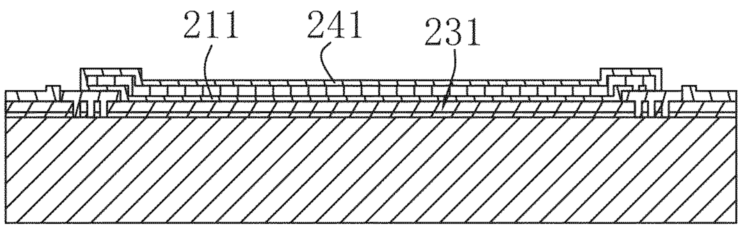
Figure 3I:
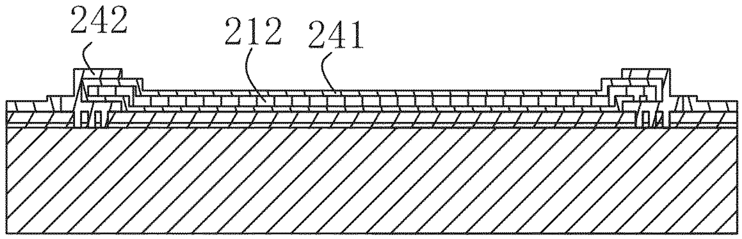
Figure 3J:
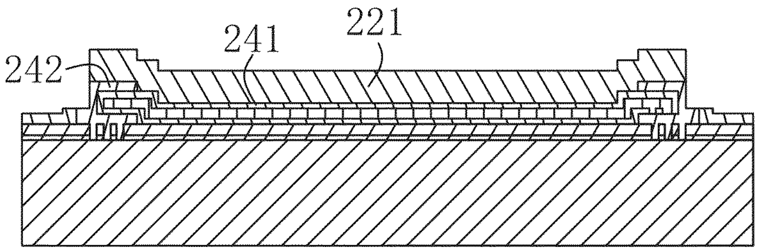
Figure 3K:
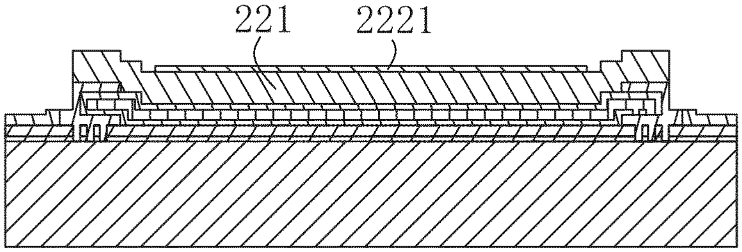
Figure 3L:
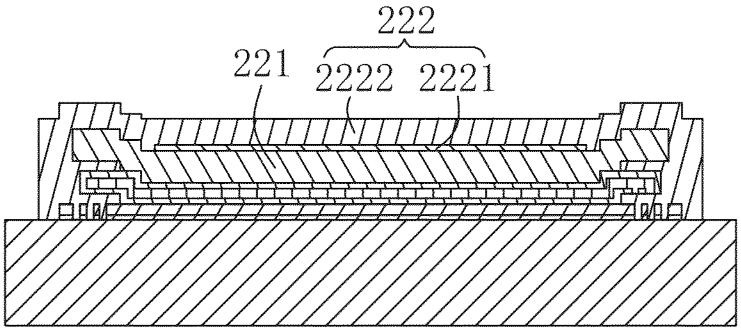
Figure 3M:
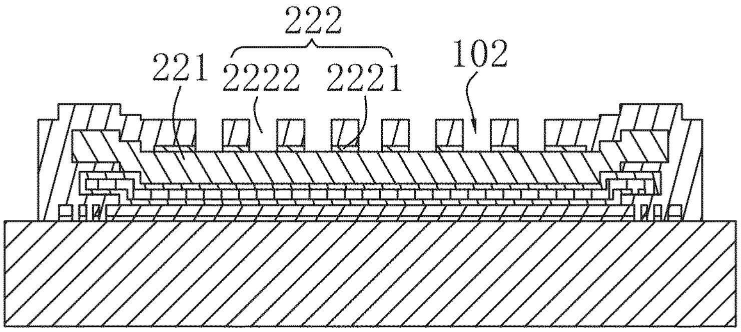
Figure 3N:
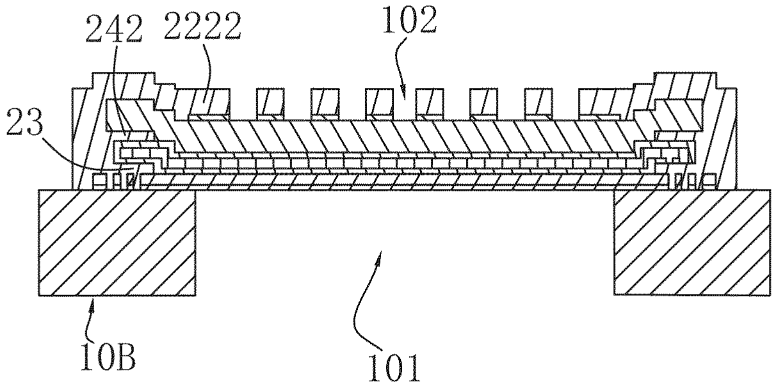
Figure 3O:
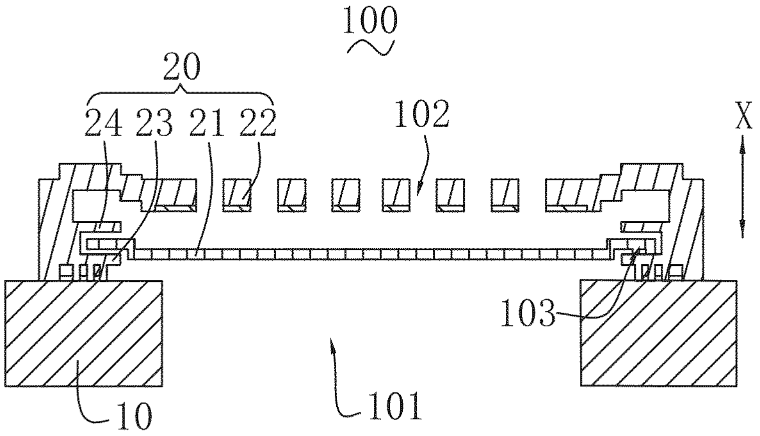

Please refer to FIGS. 3*a*-3*o*, which are flowcharts of a manufacturing method for a microphone according to an embodiment of the present disclosure. The manufacturing method is used to form the micro-electro-mechanical microphone 100 shown in FIG. 1 or FIG. 2, and may include the following steps.

At S1, a substrate 10 is provided, and a first baffle 23 is formed on a first surface 10A of the substrate 10. The step S1 includes the following steps.

At S11, a substrate 10 is provided, and a first oxide layer 231 is deposited on a first surface 10A of the substrate 10, as shown in FIG. 3*a*.

The substrate 10 is, for example, a semiconductor silicon substrate, or a substrate formed by other semiconductor materials, such as: germanium, silicon germanium, silicon carbide, gallium nitride, indium, indium gallium nitride, indium gallium arsenide, indium gallium zinc oxide, or other elements and/or compound semiconductors (e.g., III-V compound conductors such as gallium arsenide or indium phosphide), germanium or gallium nitride and the like.

The first oxide layer 231 is, for example, silicon dioxide, which can be formed by conventional processes such as thermal oxidation and vapor deposition.

In some embodiments, deposition of the first oxide layer 231 may sequentially include deposition of the first sub-oxide layer 2311 and deposition of the second sub-oxide layer 2312, and a deposition thickness of the second sub-oxide layer 2312 is greater than that of the first sub-oxide layer 2311.

In an example, in some embodiments, a ratio of the thickness of the second sub-oxide layer 2312 to the thickness of the first sub-oxide layer 2311 may be within a range from 2 to 5, for example, the thickness of the second sub-oxide layer 2312 may be 3 times or 4 times the thickness of the first sub-oxide layer 2311.

At S12, the first oxide layer 231 is patterned, the first oxide layer 231 including first connecting through-holes 104, as shown in FIG. 3*b*.

In this step, the first connecting through-holes 104 expose part of the first surface 10A of the substrate 10 to the first oxide layer 231, in order to be contact with the first silicon nitride layer 232 during a subsequent deposition process to form a connecting conductive structure.

In some embodiments of the present disclosure, a first connecting through-hole 104 that has an annular shape may be formed by etching along an edge of the first oxide layer 231 at a position close to the edge of the first oxide layer 231. A position of the edge of the first oxide layer 231 refers to a position of the edge on a plane parallel to the first surface 10A of the substrate 10. the annular shape of the first connecting through-hole 104 refers to that a cross section of the first connecting through-hole 104 on the first surface 10A parallel to the substrate 10 has an annular shape, which is similar to an outer contour of the first oxide layer 231.

In some embodiments, a plurality of first connecting through-holes 104 may be formed, and the plurality of first connecting through-holes 104 may be spaced apart from each other along a direction from a center portion to the edge portion of the first oxide layer 231. A contact area between the subsequently deposited first silicon nitride layer 232 and the substrate 10 is improved, and structural uniformity between the first silicon nitride layer 232 and the substrate 10 is improved.

At S13, a first silicon nitride layer 232 is deposited on a surface of the first oxide layer 231 until the first connecting through-holes 104 are fully filled, and the first silicon nitride layer 232 is patterned to form a first baffle 23, as shown in FIG. 3*d*.

The first silicon nitride layer 232 is patterned in such a manner that the first silicon nitride layer 232 is formed to be an annular first baffle 23.

At S2, a diaphragm 21 is formed at a side of the first baffle 23 away from the substrate 10. The step S2 includes the following steps.

At S21, a second oxide layer 211 is deposited on a surface of the first baffle 23, and the second oxide layer 211 is patterned, the second oxide layer 211 including a second connecting through-hole 2111, as shown in FIG. 3*e*.

In some embodiments, patterning the second oxide layer 211 may include: etching the second oxide layer 211 at a position close to an edge of the second oxide layer 211, to form the second connecting through-hole 2111.

At S22, a first polysilicon layer 212 is deposited on a surface of the second oxide layer 211 until the second connecting through-hole 2111 is fully filled, and the first polysilicon layer 212 is patterned to form a diaphragm 21. An orthographic projection of a periphery of the diaphragm 21 towards the first baffle 23 falls onto the first baffle 23, as shown in FIG. 3*f* to FIG. 3*g*.

In the embodiments of the present disclosure, the portion of the first polysilicon layer 212 filled into the second connecting through-hole 2111 is a subsequent connection position between the diaphragm 21 and the first baffle 23. In some embodiments, the second connecting through-hole 2111 may be formed at a position of the second oxide layer 211 along the periphery of the second oxide layer 211, thereby reducing the number of connection points between the diaphragm 21 and other members, so as to release the diaphragm 21 more. In this way, the diaphragm 21 obtains a greater degree of freedom in the vibrating direction, thereby improving the sensitivity of the micro-electro-mechanical microphone 100.

In an example, in some embodiments, a part of the diaphragm 21 corresponding to the second connecting through-hole 2111 may be an electrode lead-out structure of the diaphragm 21, so as to achieve the connection of the diaphragm 21 to be conductive at the same time.

At the same time, an orthographic projection of the periphery of the diaphragm 21 towards the first baffle 23 falls onto the first baffle 23, so that the first baffle 23 can be used to limit the diaphragm 21 at one side of the diaphragm 21 along the vibrating direction X, so that the diaphragm 21 does not have excessive displacement on this side. In this way, it prevents displacement of diaphragm 21 from reaching a degree of a fracture stress of the diaphragm 21, thereby improving the structural strength of the diaphragm 21.

At S3, a second baffle 24 is formed at a side of the diaphragm 21 away from the first baffle 23 at an interval. The step S3 includes the following steps.

At S31, a third oxide layer 241 is deposited on a surface of the diaphragm 21 and patterned to expose at least a part of the first baffle 23, as shown in FIG. 3*h*.

At S32, a second silicon nitride layer 242 is deposited on a surface of the third oxide layer 241, and the second silicon nitride layer 242 is patterned to form a second baffle 24. The second baffle 24 is connected to the first baffle 23, and an orthographic projection of the second baffle 24 towards the diaphragm 21 at least partially falls onto a periphery of the diaphragm 21, as shown in FIG. 3*i*.

The second baffle plate 24 is connected to the first baffle plate 23, which means that when depositing the second silicon nitride layer 242, the second silicon nitride layer 242 may be in contact with a part of the first baffle plate 23 exposed at S31. When subsequently patterning the second silicon nitride layer 242, a part of the second silicon nitride layer 242 in contact with the first baffle plate 23 is retained, so that the first baffle plate 23 and the second baffle plate 24 are formed into one piece, thereby improving the structural consistency of the micro-electro-mechanical microphone 100 and the structural reliability.

The orthographic projection of the second baffle 24 towards the diaphragm 21 at least partially falls onto the periphery of the diaphragm 21, which means that a structure of the second baffle 24 is similar to that of the first baffle 23, which has an annular shape corresponding to the periphery of the diaphragm 21. The second baffle 24 is used to limit the diaphragm 21 at another side of the diaphragm 21 along the vibrating direction X, so that the diaphragm 21 does not have excessive displacement on the side close to the second baffle 24. In this way, it prevents displacement of diaphragm 21 from reaching a degree of a fracture stress of the diaphragm 21, thereby improving the structural strength of the diaphragm 21.

At S4, a back-plate 22 is formed at a side of the second baffle 24 away from the diaphragm 21 at an interval, and the back-plate 22 includes acoustic through-holes 102. The step S4 includes the following steps.

At S41, a fourth oxide layer 221 is deposited on a surface of the second baffle 24, a back-plate material layer 222 is deposited on a surface of the fourth oxide layer 221, and the back-plate material layer 222 is patterned to form a back-plate 22 including acoustic through-holes 102, as shown in FIG. 3*j* to FIG. 3*m*.

Deposition of the back-plate material layer 222 may sequentially include deposition of a third silicon nitride layer 2221 and deposition of a second polysilicon layer 2222.

The acoustic through-hole 102 penetrates through the third silicon nitride layer 2221 and the second polysilicon layer 2222 along the vibrating direction X of the diaphragm 21.

At S5, s second surface 10B of the substrate 10 opposite to the first surface 10A is etched to form a back-cavity 101. The step S5 includes the following steps.

At S51, the substrate 10 is back-etched to form a back-cavity 101 corresponding to a middle main body region of the back-plate 22, as shown in FIG. 3*n*.

In an example, in some embodiments, the second surface 10B of the substrate 10 may be thinned by a grinding process, and then the second surface 10B of the substrate 10 is patterned and etched to form the back-cavity 101, and the etching stops at the first oxide layer 231.

At S52, the third oxide layer 241 and the fourth oxide layer 221 are removed through the acoustic through-hole 102, and the first oxide layer 231 and the second oxide layer 211 above the back-cavity 101 are removed through the back-cavity 101, as shown in FIG. 3*o*.

In an example, the first oxide layer 231, the second oxide layer 211, the third oxide layer 241 and the fourth oxide layer 221 may be removed by using a BOE solution or an HF vapor etching technique.

The above description merely illustrates some embodiments of the present disclosure, and it should be noted that those skilled in the art can also make improvements without departing from a concept of the present disclosure, but all of these improvements shall fall into a protection scope of the present disclosure.

What is claimed is:

1. A manufacturing method for a micro-electro-mechanical microphone, the method comprising:

providing a substrate, and depositing a first oxide layer on a first surface of the substrate;

patterning the first oxide layer, wherein the first oxide layer comprises first connecting through-holes;

depositing a first silicon nitride layer on a surface of the first oxide layer until the first connecting through-holes are fully filled, and patterning the first silicon nitride layer to form a first baffle;

depositing a second oxide layer on a surface of the first baffle, and patterning the second oxide layer, wherein the second oxide layer comprises a second connecting through-hole;

depositing a first polysilicon layer on a surface of the second oxide layer until the second connecting through-hole is fully filled, and patterning the first polysilicon layer to form a diaphragm, an orthographic projection of a periphery of the diaphragm towards the first baffle falling onto the first baffle;

depositing a third oxide layer on a surface of the diaphragm, and patterning the third oxide layer to expose at least part of the first baffle;

depositing a second silicon nitride layer on a surface of the third oxide layer, and patterning the second silicon nitride layer to form a second baffle connected to the first baffle, an orthographic projection of the second baffle towards the diaphragm at least partially falling onto the periphery of the diaphragm;

depositing a fourth oxide layer on a surface of the second baffle, depositing a back-plate material layer on a surface of the fourth oxide layer, and patterning the back-plate material layer to form a back-plate, the back-plate comprising acoustic through-holes;

back-etching the substrate to form a back-cavity corresponding to a middle main body region of the back-plate;

removing the third oxide layer and the fourth oxide layer through the acoustic through-holes, and removing the first oxide layer and the second oxide layer above the back-cavity through the back-cavity.

2. The manufacturing method for the micro-electro-mechanical microphone as described in claim 1, wherein the patterning the first oxide layer comprises: forming the first connecting through-holes each having an annular shape by etching along an edge of the first oxide layer at a position close to the edge of the first oxide layer.

3. The manufacturing method for the micro-electro-mechanical microphone as described in claim 2, wherein the first connecting through-holes are spaced apart from each other along a direction from a central portion to an edge portion of the first oxide layer.

4. The manufacturing method for the micro-electro-mechanical microphone as described in claim 1, wherein the patterning the second oxide layer comprises: forming the second connecting through-hole by etching at a position close to an edge of the second oxide layer.

5. The manufacturing method for the micro-electro-mechanical microphone as described in claim 4, wherein a part of the first polysilicon layer that fully fills in the second connecting through-hole is a lead-out electrode of the diaphragm.

6. The manufacturing method for the micro-electro-mechanical microphone as described in claim 1, wherein depositing the first oxide layer comprises: sequentially depositing a first sub-oxide layer and a second sub-oxide layer, wherein a deposition thickness of the second sub-oxide layer is greater than a deposition thickness of the first sub-oxide layer.

7. The manufacturing method for the micro-electro-mechanical microphone as described in claim 6, wherein a ratio of a thickness of the second sub-oxide layer to a thickness of the first sub-oxide layer ranges from 2 to 5.

8. The manufacturing method for the micro-electro-mechanical microphone as described in claim 1, wherein the forming the back-cavity comprises: thinning and etching the substrate from a second surface of the substrate.

9. The manufacturing method for the micro-electro-mechanical microphone as described in claim 1, wherein the depositing the back-plate material layer comprises: sequentially depositing a third silicon nitride layer and a second polysilicon layer.

* * * * *